(12) United States Patent
Ueda et al.

(10) Patent No.: US 8,869,376 B2
(45) Date of Patent: Oct. 28, 2014

(54) SUBSTRATE MOUNTING TABLE AND METHOD FOR MANUFACTURING SAME, SUBSTRATE PROCESSING APPARATUS, AND FLUID SUPPLY MECHANISM

(71) Applicant: Tokyo Electron Limited, Tokyo (JP)

(72) Inventors: Takehiro Ueda, Yamanashi (JP); Yoshiyuki Kobayashi, Yamanashi (JP); Kaoru Oohashi, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/944,948

(22) Filed: Jul. 18, 2013

(65) Prior Publication Data

US 2013/0299083 A1 Nov. 14, 2013

Related U.S. Application Data

(62) Division of application No. 11/954,832, filed on Dec. 12, 2007, now Pat. No. 8,491,752.

(60) Provisional application No. 60/891,809, filed on Feb. 27, 2007.

(30) Foreign Application Priority Data

Dec. 15, 2006 (JP) ................................. 2006-337683

(51) Int. Cl.
| | | |
|---|---|---|
| *C23C 16/00* | (2006.01) | |
| *B32B 38/10* | (2006.01) | |
| *H01L 21/687* | (2006.01) | |
| *H01L 21/683* | (2006.01) | |
| *B32B 38/08* | (2006.01) | |

(52) U.S. Cl.
CPC ................. B32B 38/08 (2013.01); B32B 38/10 (2013.01); H01L 21/68757 (2013.01); H01L 21/68735 (2013.01); H01L 21/6831 (2013.01)
USPC ......... 29/527.1; 29/527.2; 118/728; 118/724; 156/345.51; 156/345.47; 361/234; 279/128; 216/67; 216/79; 216/74; 427/448; 427/453

(58) Field of Classification Search
CPC B29C 33/56; C23C 16/4581; C23C 16/4405; C23C 16/4407; H01L 21/67063; H01L 21/6831; H01L 21/6833; B23P 2700/06
USPC ...................... 29/527.1, 527.2; 118/728, 724; 156/345.51, 345.47; 361/234; 279/128; 216/67, 79, 74; 427/448, 453
See application file for complete search history.

(56) References Cited

U.S. PATENT DOCUMENTS

| | | | |
|---|---|---|---|
| 4,338,360 A | | 7/1982 | Cavanagh et al. |
| 4,402,992 A | * | 9/1983 | Liebert .......................... 427/456 |

(Continued)

FOREIGN PATENT DOCUMENTS

| | | | |
|---|---|---|---|
| JP | 6-349938 A | | 12/1994 |
| JP | 2004-47653 A | | 2/2004 |

(Continued)

OTHER PUBLICATIONS

English Translation of JP 2004-047653 (Substrate Mounting Stand for Plasma Processing Apparatuses, and Plasma Processing Apparatus), Ueda, dated Feb. 12, 2004.

(Continued)

*Primary Examiner* — David Bryant
*Assistant Examiner* — Jun Yoo
(74) *Attorney, Agent, or Firm* — Rothwell, Figg, Ernst & Manbeck, P.C.

(57) ABSTRACT

A substrate mounting table includes a plate shaped member provided with a mounting surface for mounting a substrate thereon, a plurality of gas injection openings opened on the mounting surface to supply a gas toward the mounting surface, and a gas supply channel for supplying the gas through the gas injection openings; and a thermally sprayed ceramic layer covering the mounting surface. At least inner wall portions of the gas supply channel are formed in curved surface shapes, the inner wall portions facing the gas injection openings.

8 Claims, 5 Drawing Sheets

(56) References Cited

U.S. PATENT DOCUMENTS

| | | | |
|---|---|---|---|
| 5,835,334 A | | 11/1998 | McMillin et al. |
| 5,946,184 A | | 8/1999 | Kanno et al. |
| 6,004,620 A | * | 12/1999 | Camm .................... 427/142 |
| 6,120,661 A | * | 9/2000 | Hirano et al. ............ 204/298.15 |
| 6,159,299 A | | 12/2000 | Koai et al. |
| 6,508,884 B2 | * | 1/2003 | Kuibira et al. ................ 118/725 |
| 7,805,822 B2 | * | 10/2010 | Hanley .................... 29/81.09 |
| 2001/0054390 A1 | | 12/2001 | Halpin et al. |
| 2003/0026952 A1 | * | 2/2003 | Fried et al. ................ 428/169 |
| 2004/0123805 A1 | | 7/2004 | Tomoyoshi |
| 2004/0177927 A1 | | 9/2004 | Kikuchi et al. |
| 2005/0105243 A1 | | 5/2005 | Lee et al. |
| 2008/0217291 A1 | * | 9/2008 | Higuma et al. ............ 216/38 |

FOREIGN PATENT DOCUMENTS

| | | |
|---|---|---|
| JP | 2004-259825 A | 9/2004 |
| JP | 2006-332129 A | 12/2006 |
| JP | 2006-352151 A | 12/2006 |
| KR | 10-2003-0094492 A | 12/2003 |
| KR | 10-2005-0116078 A | 12/2005 |
| WO | 02/50884 A1 | 6/2002 |

OTHER PUBLICATIONS

English Translation of JP 2006-352151 (Electrostatic Chuck and Its Manufacturing Method), Hori, dated Dec. 28, 2006.

English Translation of KR 2003-0094492 (Application No. 1020020031449) (Chuck for Supporting a Substrate and Method of Manufacturing the Same), Lee et al, dated Dec. 12, 2003.

Japanese Office Action issued Feb. 22, 2011 in corresponding Japanese Application No. 2006-337683 (with an English Translation).

* cited by examiner

SUBSTRATE MOUNTING TABLE AND METHOD FOR MANUFACTURING SAME, SUBSTRATE PROCESSING APPARATUS, AND FLUID SUPPLY MECHANISM

CROSS-REFERENCE TO RELATED APPLICATIONS

This application claims the benefit of priority of each of the following applications and describes the relationship of the earlier applications. The present application is a Divisional Application of and claims the benefit of priority from co-pending U.S. application Ser. No. 11/954,832, filed Dec. 12, 2007, and also claims the benefit of priority from U.S. Provisional Application No. 60/891,809, filed Feb. 27, 2007. The present application is further based upon and claims the benefit of priority from the prior Japanese Patent Application No. 2006-337683, filed Dec. 15, 2006. The entire contents of foregoing applications are incorporated herein by reference.

FIELD OF THE INVENTION

The present invention relates to a substrate mounting table and a manufacturing method thereof, a substrate processing apparatus and a fluid supply mechanism; and, more particularly, to a substrate mounting table and a manufacturing method thereof, a substrate processing apparatus and a fluid supply mechanism suitable for a plasma processing of a semiconductor substrate or the like.

BACKGROUND OF THE INVENTION

Conventionally, there has been known a substrate processing apparatus for performing a plasma process such as plasma etching on, e.g., a semiconductor substrate wherein a substrate mounting table for mounting the substrate thereon is provided with a fluid supply mechanism for supplying a cooling gas such as a helium gas to a rear surface side of the substrate. Further, it is also known that a thermally sprayed ceramic layer such as an $Al_2O_3$ layer is formed on a substrate mounting surface of the substrate mounting table as an insulating layer which forms an electrostatic chuck (see, for example, Japanese Patent Laid-open Application No. 2004-47653).

For the manufacture of the aforementioned substrate mounting table, a manufacturing method can be considered wherein the method involves the steps of, for example, separately preparing a first plate shaped member provided with a number of gas supply openings and a second plate shaped member provided at its surface with grooves to be used as a gas supply channel through which a gas is introduced into the gas supply openings; integrating the two plate shaped members as a single body by welding them through a soldering process, for example; and then forming a thermally sprayed ceramic layer on a mounting surface by thermally spraying ceramic thereto.

In the above-described manufacturing method, the thermally sprayed ceramic may enter the gas supply openings during the ceramic spraying process. To avoid this, the ceramic spraying process is performed while ejecting air or the like from the gas supply openings, thus preventing the thermally sprayed ceramic from entering the gas supply openings. However, the entrance of the ceramic into the inside of the gas supply openings cannot be completely prevented by the ejection of the air or the like. Therefore, it is required to perform a cleaning process to wash off the ceramic that has entered the inside of the gas supply openings and adhered to, e.g., the bottom portions thereof.

According to thorough investigation, however, the present inventors have founded that the thermally sprayed ceramic firmly stuck to, e.g., the bottom portions of the gas supply openings may not be removed completely through the cleaning process, and some may remain as spray residue. If this spray residue is peeled off while a final product is in use, it would contaminate a semiconductor wafer or the inside of a processing chamber, or clog up the gas supply openings, resulting in a pressure reduction of a cooling gas and a failure in temperature control.

SUMMARY OF THE INVENTION

In view of the above, the present invention provides a substrate mounting table and a manufacturing method thereof, a substrate processing apparatus and a fluid supply mechanism, capable of suppressing spray residue from being left in a fluid supply channel, thus preventing contamination by the spray residue and clogging-up of the fluid supply channel with the spray residue.

In accordance with a first aspect of the present invention, there is provided a substrate mounting table including:

a plate shaped member provided with a mounting surface for mounting a substrate thereon, a plurality of gas injection openings opened on the mounting surface to supply a gas toward the mounting surface, and a gas supply channel for supplying the gas through the gas injection openings; and a thermally sprayed ceramic layer covering the mounting surface, wherein at least inner wall portions of the gas supply channel are formed in curved surface shapes, the inner wall portions facing the gas injection openings.

Preferably, the gas supply channel is shared by the gas injection openings.

Preferably, the plate shaped member includes a first plate shaped member provided with the gas injection openings and a second plate shaped member provided with grooves each having a bottom portion of a curved surface shape, the first plate shaped member and the second plate shaped member being joined to each other.

Preferably, the second plate shaped member is provided with gas supply openings for supplying a compressed gas into the gas supply channel and cleaning openings for supplying or exhausting a fluid for use in cleaning the inside of the gas supply channel.

Preferably, the plate shaped member is made of aluminum, and an anodic oxide film is formed in the gas supply channel.

In accordance with a second aspect of the present invention, there is provided a method for manufacturing a substrate mounting table including a plate shaped member provided with a mounting surface for mounting a substrate thereon, a plurality of gas injection openings opened on the mounting surface to supply a gas toward the mounting surface, and a gas supply channel for supplying the gas through the gas injection openings; and a thermally sprayed ceramic layer covering the mounting surface, the method including:

forming the plate shaped member having the gas supply channel whose at least inner wall portions facing the gas injection openings are formed in curved surface shapes;

forming the thermally sprayed ceramic layer on the mounting surface while discharging a compressed gas through the gas injection openings; and cleaning the inside of the gas supply channel.

Preferably, the gas supply channel is shared with the gas injection openings.

Preferably, the plate shaped member is formed by joining a first plate shaped member provided with the gas injection openings to a second plate shaped member provided with grooves each having a bottom portion of a curved surface shape.

Preferably, cleaning the inside of the gas supply channel is performed by supplying or exhausting a cleaning fluid into or from the gas supply channel by using gas supply openings and cleaning openings which are provided in the second plate shaped member.

Preferably, the plate shaped member is made of aluminum, and the method further comprises forming an anodic oxide film in the gas supply channel prior to forming the thermally sprayed ceramic layer.

In accordance with a third aspect of the present invention, there is provided a substrate processing apparatus including a processing chamber for accommodating and processing a substrate therein, wherein the substrate mounting table of the first aspect is disposed in the processing chamber.

In accordance with a fourth aspect of the present invention, there is provided a fluid supply mechanism including:

a plate shaped member including a first plate shaped member provided with a plurality of fluid injection openings and a second plate shaped member provided with grooves shared by the fluid injection openings and forming a fluid supply channel for supplying a fluid into the fluid injection openings, the first and the second plate shaped member being joined to each other; and a thermally sprayed ceramic layer formed on a surface of the first plate shaped member;

wherein a bottom portion of each of the grooves has a curved surface shape.

In accordance with the embodiment of the present invention, a substrate mounting table and a manufacturing method thereof, a substrate processing apparatus and a fluid supply mechanism, capable of suppressing spray residue from being left in a fluid supply channel, thus preventing contamination by the spray residue and clogging-up of the fluid supply channel with the spray residue, can be provided.

BRIEF DESCRIPTION OF THE DRAWINGS

The above features of the present invention will become apparent from the following description of an embodiment given in conjunction with the accompanying drawings, in which.

DETAILED DESCRIPTION OF THE EMBODIMENTS

Figure 1:
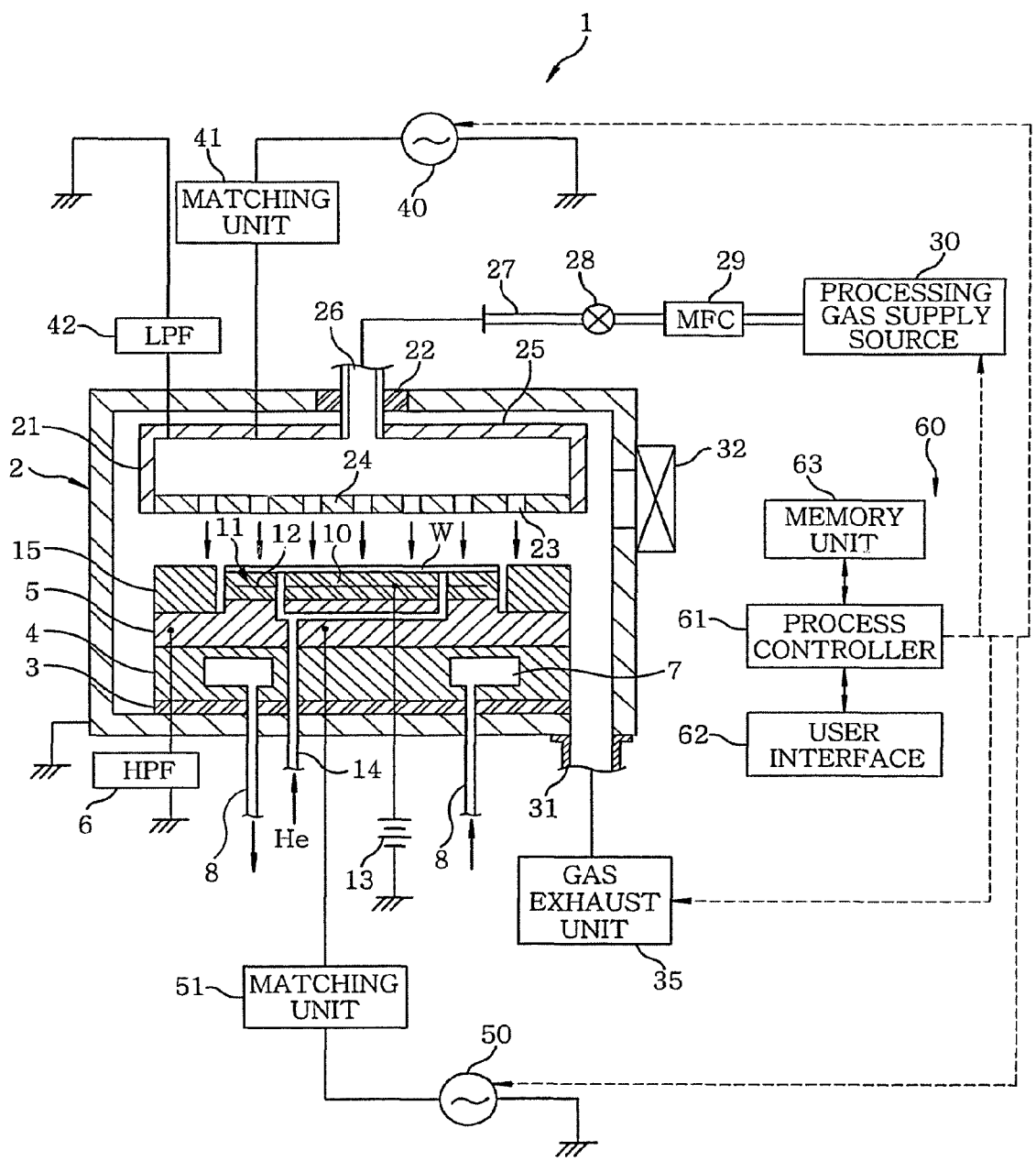
FIG. 1 illustrates a schematic configuration view of a plasma etching apparatus in accordance with an embodiment of the present invention.

Hereinafter, an embodiment of the present invention will be described in detail with reference to the accompanying drawings, which form a part hereof. FIG. 1 illustrates a cross sectional configuration view of a plasma etching apparatus 1 which is employed as a plasma processing apparatus in the present embodiment. Below, the configuration of the plasma etching apparatus 1 will be first explained with reference to FIG. 1.

The plasma etching apparatus 1 is configured as a capacitively coupled parallel plate type etching apparatus having an upper and a lower electrode plate placed to face each other in parallel and respectively connected to power supplies for plasma generation.

The plasma etching apparatus 1 has a cylindrical processing chamber (processing vessel) 2 formed of, for example, aluminum whose surface is anodically oxidized, and the processing chamber 2 is grounded. A substantially columnar susceptor support 4 for mounting thereon a target object to be processed, e.g., a semiconductor wafer W, is installed at a bottom portion of the processing chamber 2 via an insulating plate 3 such as ceramic. Further, a substrate mounting table (susceptor) 5 serving as a lower electrode is mounted on the susceptor support 4, and the substrate mounting table 5 is connected to a high pass filter (HPF) 6. A detailed configuration of the substrate mounting table 5 will be explained later.

A coolant path 7 is formed inside the susceptor support 4, and a coolant is introduced into the coolant path 7 via a coolant introducing line 8 to be circulated therethrough. By the circulation of the coolant through the coolant path 7, the cold heat of the coolant is transferred to the semiconductor wafer W via the substrate mounting table 5, whereby the semiconductor wafer W is regulated at a desired temperature level.

The substrate mounting table 5 is of a circular plate shape with an upper central portion protruded higher than its peripheral portion, and an electrostatic chuck 11 that is shaped substantially identical to the semiconductor wafer W is disposed on the upper central portion of the substrate mounting table 5. The electrostatic chuck 11 includes an electrode 12 embedded in an insulating member (made of a thermally sprayed ceramic film) 10. The semiconductor wafer W is electrostatically attracted to the electrostatic chuck 11 by, for example, a Coulomb force generated by applying a DC voltage of, for example, 1.5 kV to the electrode 12 from a DC power supply 13 connected thereto.

Further, formed through the insulating plate 3, the susceptor support 4, the substrate mounting table 5 and the electrostatic chuck 11 is a gas channel 14 for supplying a heat transfer medium (e.g., a He gas) to the rear surface of the semiconductor wafer W. Thus, the cold heat of the substrate mounting table 5 is transferred to the semiconductor wafer W through the heat transfer medium, so that the wafer W is maintained at a specific temperature level.

An annular focus ring 15 is disposed on the periphery of the top surface of the substrate mounting table 5 to surround the semiconductor wafer W loaded on the electrostatic chuck 11. The focus ring 15 is formed of a conductive material such as silicon and serves to improve uniformity of etching.

An upper electrode 21 is disposed above the substrate mounting table 5, while facing it in parallel. The upper electrode 21 is supported at an upper portion of the processing chamber 2 via an insulating member 22. The upper electrode 21 includes an electrode plate 24; and an electrode support 25 that serves to support the electrode 24 and is formed of a conductive material. The electrode plate 24 is configured to face the substrate mounting table 5 and is provided with a number of gas injection openings 23. The electrode plate 24 is formed of, for example, silicon or aluminum whose surface is anodically oxidized (alumite treated) with a quartz cover attached thereto. A distance between the substrate mounting table 5 and the upper electrode 21 is variable.

A gas inlet port 26 is formed at a center of the electrode support 25 of the upper electrode 21, and a gas supply line 27 is coupled to the gas inlet port 26. Further, the gas supply line 27 is connected to a processing gas supply source 30 via a valve 28 and a mass flow controller 29.

A gas exhaust line 31 is connected to a bottom portion of the chamber 2, and a gas exhaust unit 35 is coupled to the gas exhaust line 31. The gas exhaust unit 35 includes a vacuum pump such as a turbo molecular pump, and serves to create a depressurized atmosphere in the processing chamber 2, i.e., to evacuate the processing chamber 2 such that the internal pressure thereof is reduced down to a specific vacuum level, e.g., 1 Pa or less. Further, a gate valve 32 is installed at a sidewall of the processing chamber 2. The semiconductor wafer W is transferred between the processing chamber 2 and an adjacent load lock chamber (not shown) while the gate valve 32 is opened.

A first high frequency power supply 40 is connected to the upper electrode 21 via a matching unit 41. Further, a low pass filter (LPF) 42 is connected to the upper electrode 21. The first high frequency power supply 40 has a frequency range from about 50 to 150 MHz. By applying a high frequency power in such a high frequency range, a high-density plasma in a desirable dissociated state can be generated in the processing chamber 2.

Further, a second high frequency power supply 50 is connected to the substrate mounting table 5 serving as the lower electrode via a matching unit 51. The second high frequency power supply 50 has a frequency range lower than that of the first high frequency power supply 40. By applying a power of a frequency in such a range, a proper ionic action can be facilitated without causing any damage on the semiconductor wafer W, which is an object being processed. Preferably, the frequency of the second high frequency power supply 50 is determined within a range from about 1 to 20 MHz.

The whole operation of the plasma etching apparatus 1 having the above-described configuration is controlled by a control unit 60. The control unit 60 includes a process controller 61 having a CPU for controlling each component of the plasma etching apparatus 1; a user interface 62; and a memory unit 63.

The user interface 62 includes a keyboard for a process manager to input a command to manipulate the plasma etching apparatus 1; a display for visualizing an operational status of the plasma etching apparatus 1; and the like.

The memory unit 63 stores therein recipes including control programs (softwares), processing condition data and the like to be used in realizing various processes, which are performed in the plasma etching apparatus 1 under the control of the process controller 61. When a command is received from the user interface 62, a necessary recipe is retrieved from the memory unit 63 and is executed by the process controller 61, whereby a desired process is performed in the plasma etching apparatus 1 under the control of the process controller 61. The necessary recipes including control programs, processing condition data and the like can be retrieved from a computer-readable storage medium (e.g., a hard disk, a CD, a flexible disk, a semiconductor memory, and the like), or can be transmitted from another apparatus via, e.g., a dedicated line, if necessary.

When a semiconductor wafer W is plasma etched by the plasma etching apparatus 1 configured as described above, the gate valve 32 is opened first, and then the semiconductor wafer W is loaded into the processing chamber 2 from the load lock chamber (not shown) and mounted on the electrostatic chuck 11. Then, a DC voltage is applied from the DC power supply 13, whereby the semiconductor wafer W is electrostatically attracted to the electrostatic chuck 11 to be held thereon. Subsequently, the gate valve 32 is closed, and the processing chamber 2 is evacuated to a specific vacuum level by the gas exhaust unit 35.

Thereafter, the valve 28 is opened, and a processing gas (etching gas) is supplied from the processing gas supply source 30 into a hollow space of the upper electrode 21 via the gas supply line 27 and the gas inlet port 26 while its flow rate is controlled by the mass flow controller 29. Then, the processing gas is discharged uniformly toward the semiconductor wafer W through the injection openings 23 of the electrode plate 24, as indicated by arrows in FIG. 1.

Then, the internal pressure of the processing chamber 2 is maintained at a specific pressure level, and then a high frequency power of a specific frequency is applied to the upper electrode 21 from the first high frequency power supply 40, whereby a high frequency electric field is generated between the upper electrode 21 and the substrate mounting table 5 serving as the lower electrode. As a result, the processing gas is dissociated and converted into a plasma.

Meanwhile, a high frequency power of a frequency lower than that from the first high frequency power supply 40 is applied to the substrate mounting table 5 serving as the lower electrode from the second high frequency power supply 50. As a result, ions in the plasma are attracted toward the substrate mounting table 5, so that etching anisotropy is improved by ion assist.

Then, upon the completion of the plasma etching, the supply of the high frequency powers and the processing gas is stopped, and the semiconductor wafer W is retreated out of the processing chamber 2 in the reverse sequence as described above.

Figure 2:
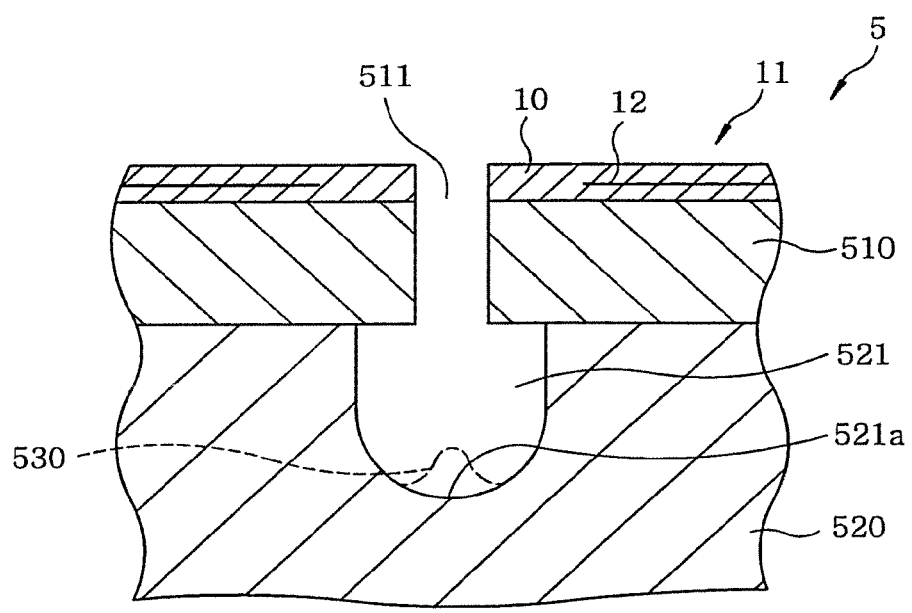
FIG. 2 illustrates an enlarged cross sectional configuration view of major parts of a substrate mounting table in accordance with the embodiment of the present invention.
Figure 3:
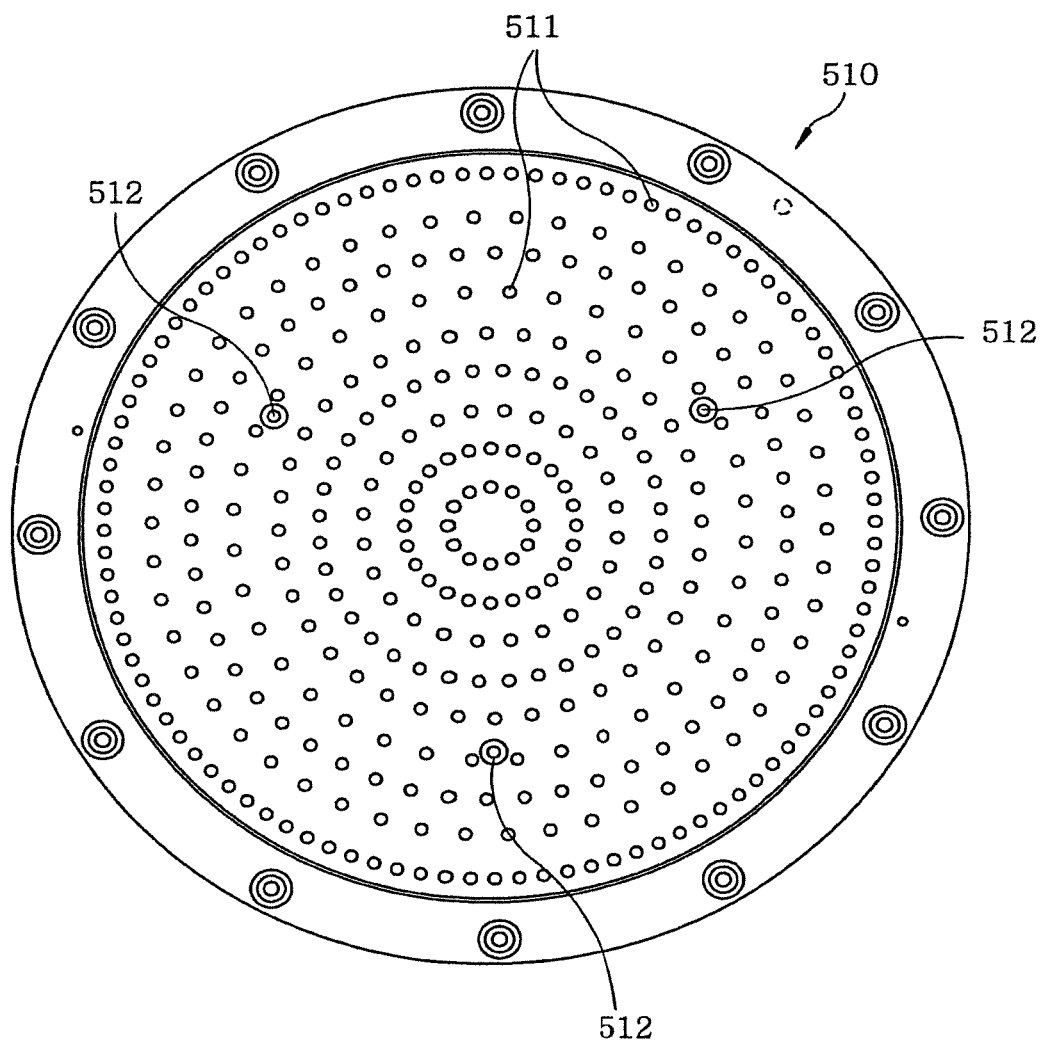
FIG. 3 illustrates a top surface configuration view of a first plate shaped member of the substrate mounting table of FIG. 2.
Figure 4:
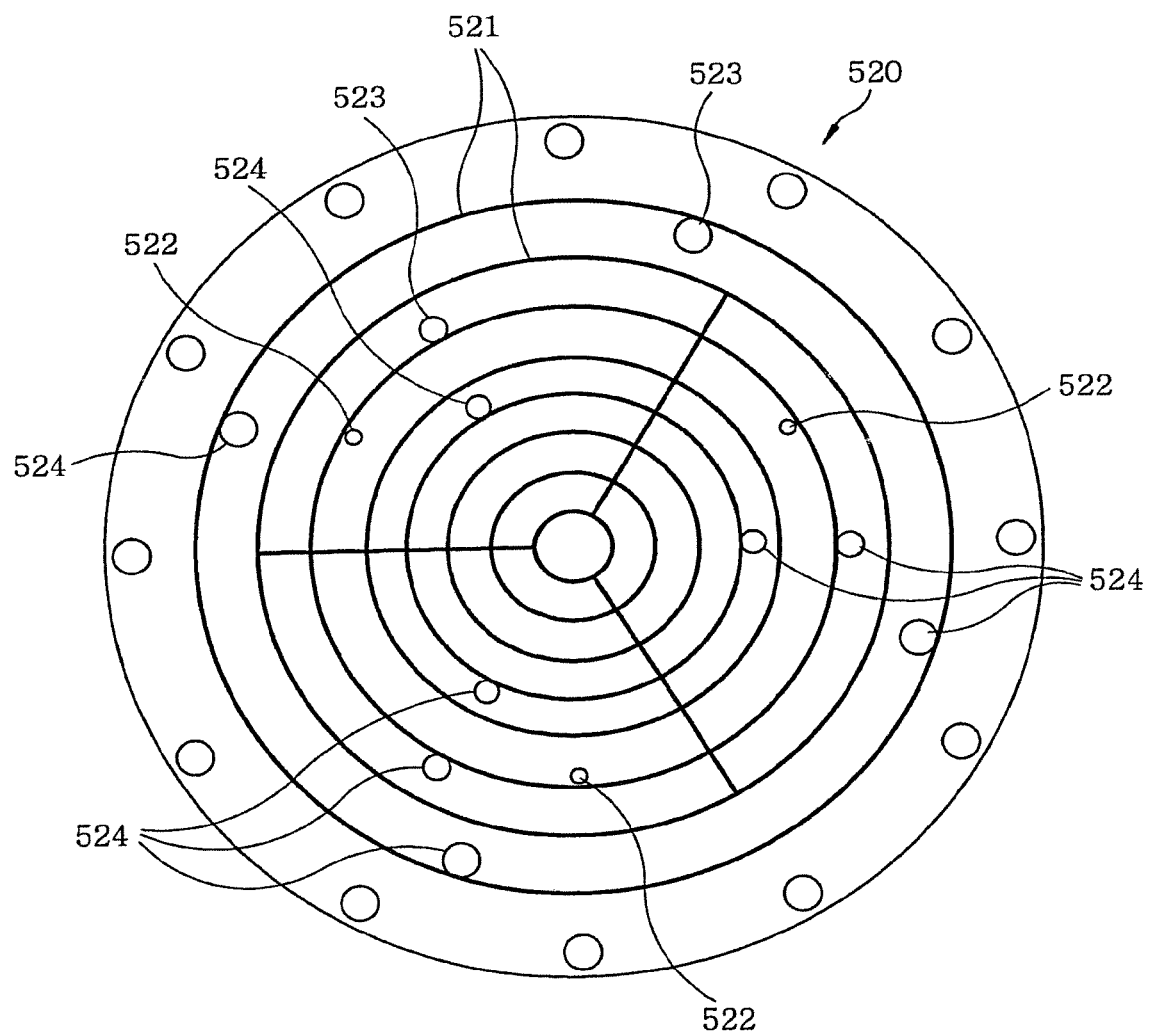
FIG. 4 illustrates a top surface configuration view of a second plate shaped member of the substrate mounting table of FIG. 2.

Below, the substrate mounting table (susceptor) 5 in accordance with the embodiment of the present invention will be described in further detail with reference to FIGS. 2 to 4. As shown in FIGS. 2 to 4, the substrate mounting table 5 includes a first circular plate shaped member 510 and a second circular plate shaped member 520 that are adjoined to each other to form a circular plate shape as a whole. In the present embodiment, the first plate shaped member 510 and the second plate shaped member 520 are formed of aluminum.

As illustrated in FIGS. 2 and 3, the first plate shaped member 510 is provided with a number of gas injection openings 511. Further, as shown in FIGS. 2 and 4, the second plate shaped member 520 is provided with grooves 521 concentrically formed to serve as a gas supply channel for supplying a gas to each gas injection opening 511. Among the grooves 521, an outermost groove 521 is shared by a plurality of gas injection openings 511 provided at the outermost portion of the first plate shaped member 510. The rest concentric grooves 521 other than the outermost one and diametrical grooves connecting them are shared by a multiplicity of gas injection openings 511 provided inside the outermost portion of the first plate shaped member 510. With this configuration, it is possible to control a cooling gas pressure for each of the outermost (edge) region and the rest region of the semiconductor wafer W individually.

Further, as shown in FIG. 3, the first plate shaped member 510 has three pin holes 512 which accommodate therein pins for moving the semiconductor wafer W up and down when the semiconductor wafer W is mounted thereon. The second plate shaped member 520 also has pin holes 522 at locations corresponding to the pin holes 512 of the first plate shaped member 510, as shown in FIG. 4. Furthermore, as illustrated in FIG. 4, the second plate shaped member 520 is provided with two gas supply openings 523: one for supplying a cooling gas to the outermost groove 521 and the other for supplying the cooling gas to the rest grooves 521. Further, the second plated shaped member 520 is also provided with a plurality (eight in the shown example of FIG. 4) of cleaning openings 524 for use in cleaning the grooves 521. These cleaning openings 524 are used in a cleaning process or the like in a manufacturing process of the substrate mounting table to be described later. Thus, when the substrate mounting table 5 is in use, the cleaning openings 524 are closed by clogging or plugging members.

Each of the gas injection openings 511 shown in FIG. 2 has a diameter of, e.g., about 1 mm. Meanwhile, each of the grooves 521 shown in FIG. 2 has a width of, e.g., about 3 mm and a depth of, e.g., about 2 mm. Further, a bottom portion 521a of each groove 521 has a curved surface shape, and in the present embodiment, its cross section is formed as an R surface protruding downward and having a radius of, e.g., about 1.5 mm. The reason why the bottom portion 521a is formed in the curved surface shape is to hinder a firm adherence of thermally sprayed ceramic to the bottom portion 521a. Accordingly, though only the portions of the bottom portion 521a facing the gas injection openings 511 (i.e., only the portions of the bottom portion 521a around the regions directly under the gas injection openings 511) can be formed in the curved surface shapes, the entire bottom portion 521a of the groove 521 is formed in the curved surface shape in the present embodiment so that the whole part of the groove 521 is formed through a same machining process. The grooves 521 form a gas supply channel through which the cooling gas is supplied to the gas injection openings 511, and the inner walls of the gas supply channel including the inside of the grooves 521, are covered with an anodic oxide film (alumite film, not shown).

The electrostatic chuck 11 is disposed on the mounting surface at the top of the first plate shaped member 510. The electrostatic chuck 11 includes the electrode 12 embedded in the insulating member 10 made of a thermally sprayed ceramic film such as an $Al_2O_3$ film. The electrode 12 is formed of a metal (in the present embodiment, a thermally sprayed tungsten film).

Hereinafter, a manufacturing method of the substrate mounting table 5 will be explained. First, the first plate shaped member 510 is prepared by forming the gas injection openings 511 in a circular plate made of aluminum, and the second plate member 520 is prepared by forming the grooves 521 serving as the gas supply channel to the gas injection openings 511 in a circular plate made of aluminum. Further, the aforementioned pin holes 512 are also formed in the first plate shaped member 510, and the pin holes 522, the gas supply openings 523 and the cleaning openings 524 are also formed in the second plated shaped member 520.

Figure 5:
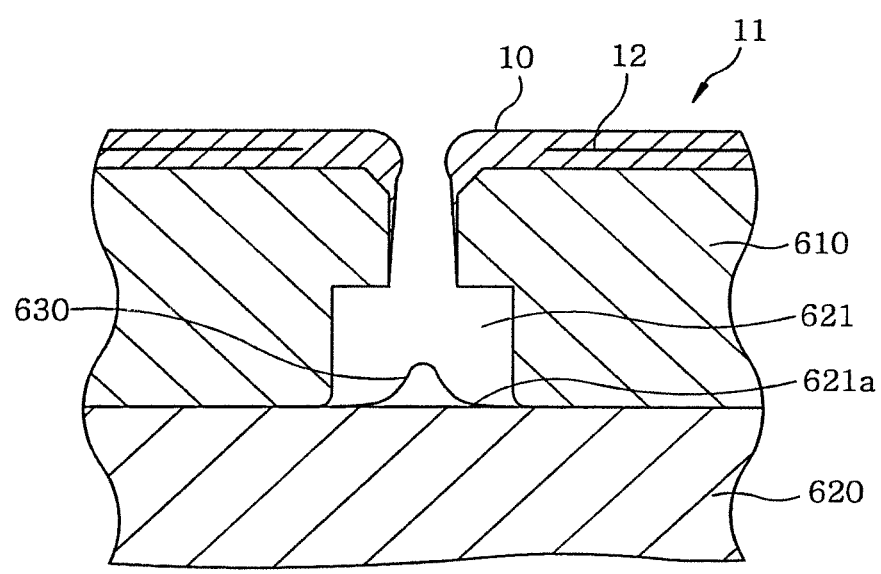
FIG. 5 illustrates an enlarged cross sectional configuration view of major parts of a substrate mounting table in accordance with a comparative example.

Thereafter, the first plate shaped member 510 and the second plate shaped member 520 are welded together through, for example, a soldering process. In the soldering process, surfaces of the plate shaped members 510 and 520 near a joint surface therebetween tend to be roughened. If their surfaces become rough, however, thermally sprayed ceramic is more likely to firmly adhere to the rough surface portions during a ceramic spraying process to be described later. For example, if a first plate member 610 and a second plate member 620 are welded together at a bottom portion 621a of a groove 621 as shown in FIG. 5, the bottom portion 621a would be roughened, thereby increasing the likelihood that a lump 630 of thermally sprayed ceramic is firmly stuck to the bottom portion 621a. In view of this, in the present embodiment, the first plate shaped member 510 and the second plate shaped member 520 are soldered at an upper portion of the groove 521, not the bottom portion thereof. By employing this configuration, it is possible to suppress the roughening of the bottom portion 521a of the groove 521 to which a lump 530 of the thermally sprayed ceramic is highly likely to adhere.

Then, by an anodic oxidation process (alumite process), an anodic oxide film (alumite film) is formed on inner surfaces of the gas injection openings 511 and the portions serving as the gas supply channel including inner surfaces of the groove 521. This anodic oxide film has an effect of interfering with a firm adherence of thermally sprayed ceramic. In the formation of the anodic oxide film, the anodic oxide film can be given a smooth surface because the bottom portion 521a of the groove 521 is not roughened, as mentioned above. The anodic oxide film with the smooth surface further enhances the effect of interfering with the firm adherence of the thermally sprayed ceramic.

Subsequently, while supplying a gas such as compressed air through the gas supply openings 523, the cleaning openings 524 and the like and ejecting the gas through the gas injection openings 511, a thermally sprayed ceramic film such as an $Al_2O_3$ film, a thermally sprayed metal film (electrode) 12, and a thermally sprayed ceramic film 10 are sequentially deposited on the mounting surface, thereby forming the electrostatic chuck 11 with triple layers. At this time, though it is difficult for the thermally sprayed ceramic to enter the gas injection openings 511 due to the ejection of the gas, some of the thermally sprayed ceramic may nevertheless enter the gas injection openings 511 and stick to the bottom portion 521a of the groove 521 in the form of the lump 530. In the present embodiment, however, since the bottom portion 521a of the groove 521 has the curved surface as shown in FIG. 2, a firm adherence of the thermally sprayed ceramic having entered to the gas injection openings 511 to the bottom portion 521a of the groove 521 can be prevented in comparison with the case the bottom portion 621a of the groove 621 have flat surfaces.

Lastly, a cleaning process is performed by introducing a fluid, for example, compressed air or water, into the groove 521 to remove the lump 530 of the thermally sprayed ceramic that has adhered to the inside of the groove 521 during the ceramic spraying process. This cleaning process is carried out by using the cleaning openings 524 and the gas supply openings 523 shown in FIG. 4 and can be implemented by an appropriate combination of an air purging step using the compressed air, a step of simultaneously performing an air purging using the compressed air and flowing a water through the groove 521, an immersion step using a solvent such as acetone, and the like. At this time, since the thermally sprayed ceramic having entered the gas injection openings 511 is not so firmly adhered to the groove 521 as described above, the lump 530 of the thermally sprayed ceramic can be readily removed from the groove 521, thus greatly reducing the probability of the presence of spray residue in the groove 521, in comparison with conventional cases.

In practice, as for a sample having the same configuration illustrated in FIG. 2, the cleaning process was performed after the ceramic spraying process, and it was revealed that the ceramic lump 530 can be all removed through the air purging step only, so that the number of residual ceramic lumps 530 in the grooves 521 counted zero. Meanwhile, as a comparative example, a substrate mounting table with a groove 621 having a flat bottom portion 621a as shown in FIG. 5 was inspected, and it was found that six lumps 630 of thermally sprayed ceramic still remained, i.e., the number of remaining lumps 630 does not reach zero, after the cleaning process, even though the air purging step, the step of simultaneously performing the air purging and flowing the water through the groove 521, the acetone immersion step, the air purging step, and the step of simultaneously performing the air purging and flowing the water through the groove 521 performed in sequence.

In accordance with the present embodiment described above, a stay of spray residue inside the cooling gas supply channel can be prevented, so that contamination by the spray residue or clogging of the fluid supply channel with the spray residue can be avoided. Further, it is to be noted that the present invention can be modified in various ways without being limited to the present embodiment. For example, though the present invention is applied to the plasma etching apparatus in the above embodiment, the application of the present invention is not limited to the plasma etching apparatus but can be applied to various substrate processing apparatuses such as a CVD apparatus and the like. Moreover, through the above embodiment has been described for the case of applying the present invention to the substrate mounting table which supplies the cooling gas, the present invention can be applied to various other types of fluid supply mechanisms for supplying other kinds of fluids such as a processing gas or the like.

While the invention has been shown and described with respect to the embodiment, it will be understood by those skilled in the art that various changes and modification may be made without departing from the scope of the invention as defined in the following claims.

What is claimed is:

1. A method of manufacturing a substrate mounting table comprising:
   preparing a first plate shaped member having a plurality of gas injection openings;
   preparing a second plate shaped member provided with a plurality of grooves configured to serve as a gas supply channel supplying a gas to the gas injection openings;
   joining the first plate shaped member and the second plate shaped member;
   forming a layer on a surface of the first plate shaped member by a thermal spraying process while flowing a first fluid through the grooves; and
   removing lumps attached to the grooves during said forming the layer by introducing a second fluid for cleaning into the grooves,
   wherein a size of each of the gas injection openings is smaller than a width of each of the grooves at a joint surface of the first and the second plate shaped member,
   wherein a bottom of each of the grooves has a curved shape,
   wherein said preparing the second plate shaped member includes forming a plurality of gas supply openings and a plurality of cleaning openings extending through the second plate shaped member and into the grooves, and the method further comprises, after said removing the lumps, closing the plurality of cleaning openings by plugging members, and wherein the second fluid is introduced into the grooves through the cleaning openings, and
   wherein the second fluid for cleaning is supplied into or exhausted from the gas supply channel by using the gas supply openings and the cleaning openings.

2. The method of claim 1, wherein said removing the lumps includes at least one of air-purging an inside of the grooves, air-purging the inside of the grooves and flowing water through the grooves and immersing the grooves into a solvent.

3. The method claim 1, wherein said forming the layer includes sequentially depositing a first thermally sprayed ceramic film, a thermally sprayed metal film, and a second thermally sprayed ceramic film to thereby provide an electrostatic chuck.

4. The method of claim 1, wherein the second plate shaped member is made of aluminum, and the method further comprises forming an anodic oxide film in the grooves prior to said forming the layer.

5. A method of manufacturing a substrate mounting table comprising:
   preparing a first plate shaped member having a plurality of gas injection openings;
   preparing a second plate shaped member provided with a plurality of grooves configured to serve as a gas supply channel supplying a gas to the gas injection openings;
   joining the first plate shaped member and the second plate shaped member;
   forming a layer on a surface of the first plate shaped member by a thermal spraying process while flowing a first fluid through the grooves; and
   removing lumps attached to the grooves during said forming the layer by introducing a second fluid for cleaning into the grooves,
   wherein a size of each of the gas injection openings is smaller than a width of each of the grooves at a joint surface of the first and the second plate shaped member, and
   wherein a bottom of each of the grooves has a curved shape,
   wherein the gas injection openings are concentrically disposed and at least a part of the grooves is concentrically formed with regard to each other,
   wherein said preparing the second plate shaped member includes forming a plurality of cleaning openings extending through the second plate shaped member and into the grooves, and the method further comprises, after said removing the lumps, closing the plurality of cleaning openings by plugging members, and
   wherein the second fluid is introduced into the grooves through the cleaning openings.

6. The method of claim 5, wherein said removing the lumps includes at least one of air-purging an inside of the grooves, air-purging the inside of the grooves and flowing water through the grooves and immersing the grooves into a solvent.

7. The method claim 5, wherein said forming the layer includes sequentially depositing a first thermally sprayed ceramic film, a thermally sprayed metal film, and a second thermally sprayed ceramic film to thereby provide an electrostatic chuck.

8. The method of claim 5, wherein the second plate shaped member is made of aluminum, and the method further comprises forming an anodic oxide film in the grooves prior to said forming the layer.

* * * * *